(12) United States Patent
Luo

(10) Patent No.: US 12,148,839 B2
(45) Date of Patent: Nov. 19, 2024

(54) SEMICONDUCTOR DEVICE AND ELECTRONIC DEVICE

(71) Applicant: WUHAN CHINA STAR OPTOELECTRONICS TECHNOLOGY CO., LTD., Hubei (CN)

(72) Inventor: Chengzhi Luo, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/759,866

(22) PCT Filed: Jul. 28, 2022

(86) PCT No.: PCT/CN2022/108652
§ 371 (c)(1),
(2) Date: Aug. 1, 2022

(87) PCT Pub. No.: WO2024/007385
PCT Pub. Date: Jan. 11, 2024

(65) Prior Publication Data
US 2024/0186420 A1    Jun. 6, 2024

(30) Foreign Application Priority Data
Jul. 8, 2022 (CN) .......................... 202210804923.7

(51) Int. Cl.
*H01L 29/786* (2006.01)
*G02F 1/1368* (2006.01)
(Continued)

(52) U.S. Cl.
CPC .... *H01L 29/78675* (2013.01); *G02F 1/13685* (2021.01); *H01L 27/1222* (2013.01);
(Continued)

(58) Field of Classification Search
CPC ............. H01L 29/78696; H01L 29/068; H01L 29/78624; H01L 29/16; H01L 29/0684; H01L 29/78672; G02F 2001/13685
See application file for complete search history.

(56) References Cited

U.S. PATENT DOCUMENTS 7,745,822 B2 * 6/2010 Okumura ............ H01L 27/1251
257/75
2002/0053672 A1 * 5/2002 Yamazaki .............. H10B 12/30
257/E27.111
(Continued)

FOREIGN PATENT DOCUMENTS

CN    104576753 A    4/2015
CN    106206622 A    12/2016
(Continued)

OTHER PUBLICATIONS

English translation of CN-112071868-A, Ye (Year: 2020).*
(Continued)

*Primary Examiner* — Jonathan Y Jung

(57) ABSTRACT

The present application provides a semiconductor device and an electronic device. In the semiconductor device, a metal layer is provided on the side of the active layer facing the buffer layer, and the metal layer includes at least one metal block, so that the metal block is in direct contact with at least part of the active layer, then when the active layer is converted from amorphous silicon to polycrystalline silicon, due to the catalytic effect of the metal block, the size of the crystal grains in the polycrystalline silicon becomes larger, which reduces the crystal grain boundaries in the polycrystalline silicon and improves the mobility of the semiconductor device.

18 Claims, 6 Drawing Sheets

(51) Int. Cl.
*H01L 27/12* (2006.01)
*H01L 29/66* (2006.01)
*H10K 59/12* (2023.01)

(52) U.S. Cl.
CPC .. *H01L 29/66757* (2013.01); *H01L 29/78654* (2013.01); *G02F 2202/104* (2013.01); *H10K 59/12* (2023.02)

(56) References Cited

U.S. PATENT DOCUMENTS

| | | | | |
|---|---|---|---|---|
| 2007/0295973 | A1* | 12/2007 | Jinbo | H01L 27/1266 257/88 |
| 2010/0171546 | A1 | 7/2010 | Kwok | |
| 2018/0323248 | A1* | 11/2018 | Jinta | H10K 50/13 |

FOREIGN PATENT DOCUMENTS

| | | | |
|---|---|---|---|
| CN | 106601823 A | | 4/2017 |
| CN | 112071868 A | * | 12/2020 |

OTHER PUBLICATIONS

International Search Report in International application No. PCT/CN2022/108652, mailed on Dec. 19, 2022.
Written Opinion of the International Search Authority in International application No. PCT/CN2022/108652, mailed on Dec. 19, 2022.

* cited by examiner (a)

(b)

(a)

(b)

(a)

(b)

(c)

SEMICONDUCTOR DEVICE AND ELECTRONIC DEVICE

BACKGROUND OF INVENTION

Field of Invention

The present application relates to the field of display technology, and in particular, to a semiconductor device and an electronic device.

Description of Prior Art

With the development of display technology, existing display devices put forward higher and higher requirements for narrow bezel, high aperture ratio, high brightness, and high resolution. Therefore, it is necessary to reduce sizes of thin film transistors while maintaining good on-state current. Existing semiconductor devices adopt polysilicon as an active layer to improve carrier mobility and increase on-state current. However, in the manufacturing process of polysilicon, due to the limitation of the process, a grain size of the polysilicon formed after laser annealing is small, resulting in low carrier mobility, resulting in low on-state current of semiconductor devices, which cannot meet the demand.

Therefore, the existing semiconductor devices have the technical problem that mobility of the semiconductor devices is low due to a small grain size of the polysilicon caused by the process limitation.

Embodiments of the present application provide a semiconductor device and an electronic device, so as to alleviate the technical problem of low mobility of the semiconductor device caused by a small grain size of polysilicon caused by process limitations in the existing semiconductor device.

SUMMARY OF INVENTION

In order to solve the above-mentioned problems, technical solutions provided by the present application are as follows:

An embodiment of the present application provide a semiconductor device, wherein the thin film transistor includes:
a substrate;
a buffer layer disposed on a side of the substrate; and
an active layer disposed on a side of the buffer layer away from the substrate,
wherein the semiconductor device further includes a metal layer, the metal layer is disposed on a side of the active layer facing the buffer layer, the metal layer includes at least one metal block, and the metal block is in direct contact with at least part of the active layer.

In some embodiments, a region of the buffer layer in contact with the active layer is provided with a groove, and the metal block is provided in the groove.

In some embodiments, a material of the metal layer has a melting point of less than 1410 degrees Celsius.

In some embodiments, the material of the metal layer includes at least one of aluminum, nickel, gallium, or indium.

In some embodiments, the semiconductor device further includes a plurality of thin film transistors, and an active layer of at least one of the thin film transistors has no grain boundaries.

In some embodiments, the active layer of the thin film transistor includes a first crystal grain, the first crystal grain is disposed corresponding to the metal block, and a number of the first crystal grain is equal to a number of the metal block.

In some embodiments, the first crystal grain is circular or quasi-circular, and a diameter of the first crystal grain is 1 to 5 microns.

In some embodiments, the thin film transistor includes a plurality of first crystal grains, the metal layer includes metal blocks arranged in an array, and a grain boundary of the first dies are located between adjacent ones of the metal blocks.

In some embodiments, the active layer includes a channel portion and a first doping portion and a second doping portion located on opposite sides of the channel portion, a shape of a hypothetical connection line between the first doping portion and the second doping portion along the channel portion between the first doping portion and the second doping portion is same as a hypothetical connection line between the metal blocks corresponding to the first doping portion and the second doping portion of the thin film transistor along the channel portion.

In some embodiments, a shape of the hypothetical connection line between the first doping portion and the second doping portion along the channel portion between the first doping portion and the second doping portion is a straight line, and the metal blocks are arranged along the straight line in an array.

In some embodiments, the first doping portion and the second doping portion are located on a same horizontal line, and the shape of the hypothetical connection line between the first doping portion and the second doping portion along the channel portion between the first doping portion and the second doping portion is a polyline, and the metal blocks are arranged along the polyline in an array.

In some embodiments, the channel portion includes a first portion disposed in a vertical direction of the first doping portion, a second portion disposed in a vertical direction of the second doping portion, and a third portion vertically connected to the first portion and the second portion: the hypothetical connection line between the first doping portion and the second doping portion along the channel portion between the first doping portion and the second doping portion is arranged along the first portion, the third portion, and the second portion; and the metal blocks are arranged in an array along the first portion, the third portion, and the second portion.

In some embodiments, the channel portion includes a fourth portion and a fifth portion connecting the first doping portion and the second doping portion, the fourth portion is arranged perpendicular to the fifth portion, and the metal blocks are arranged in an array along a direction of the fourth portion and the fifth portion.

In some embodiments, a diameter of the first crystal grains is equal to a distance between center points of adjacent ones of the metal blocks.

In some embodiments, a thickness of each of the metal blocks ranges from 0.05 microns to 0.5 microns.

In some embodiments, a spacing between the metal blocks is 1 to 5 microns.

In some embodiments, a width of each of the metal blocks ranges from 0.5 microns to 2 microns.

Meanwhile, an embodiment of the present application provides an electronic device, wherein the electronic device includes the semiconductor device according.

In some embodiments, the electronic device further includes a liquid crystal display panel.

In some embodiments, the electronic device further includes an organic light-emitting diode display panel.

In some embodiments, the buffer layer is provided with a groove in a region in contact with the active layer, and the metal block is provided in the groove.

The present application provides a semiconductor device and an electronic device: the semiconductor device includes a thin film transistor, the thin film transistor includes a substrate, a buffer layer, and an active layer; the buffer layer is disposed on a side of the substrate; and the active layer is disposed on a side of the buffer layer away from the substrate. The semiconductor device further includes a metal layer, the metal layer is disposed on a side of the active layer facing the buffer layer, the metal layer includes at least one metal block, and the metal block is in direct contact with at least part of the active layer. In the present application, a metal layer is disposed on a side of the active layer facing the buffer layer, and the metal layer includes at least one metal block, so that the metal block is in direct contact with at least part of the active layer, and when the active layer is converted from amorphous silicon to polysilicon, due to a catalytic effect of the metal block, a size of the crystal grains in the polysilicon becomes larger, which reduces grain boundaries in the polysilicon and improves the mobility of the semiconductor device.

DETAILED DESCRIPTION OF PREFERRED EMBODIMENTS

The technical solutions in the embodiments of the present application will be clearly and completely described below. Obviously, the described embodiments are only a portion of the embodiments of the present application, but not all of the embodiments. Based on the embodiments in the present application, all other embodiments obtained by a person of ordinary skill in the art without creative efforts shall fall within the protection scope of the present application.

In view of the technical problem of low mobility of the semiconductor device caused by a small grain size of polysilicon due to process limitations in the existing semiconductor device, the embodiments of the present application provide a semiconductor device and an electronic device to alleviate the above technical problem.

Figure 1:
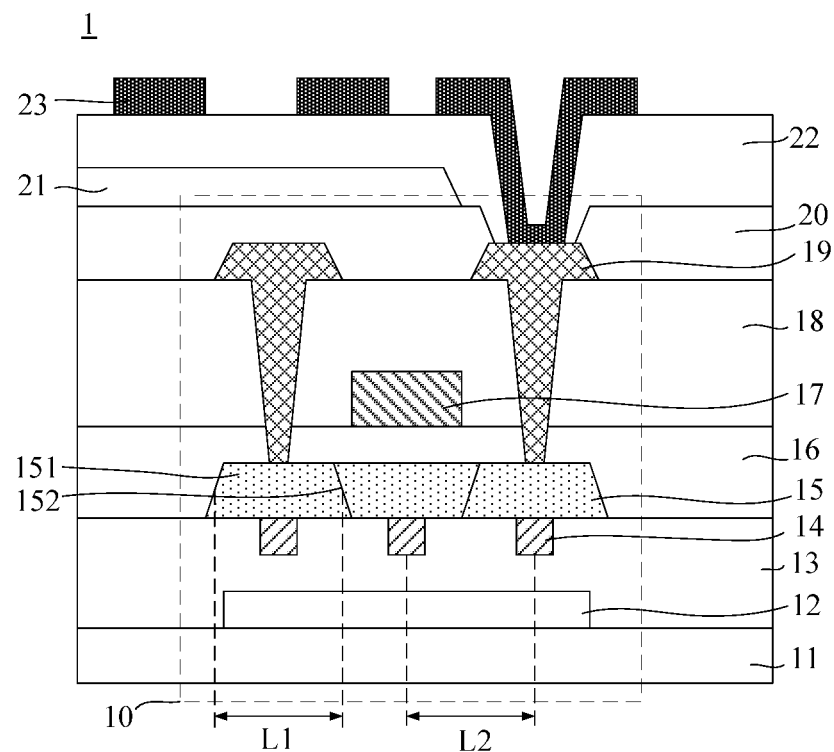
FIG. 1 is a first schematic diagram of a semiconductor device provided by an embodiment of the present application.

As shown in FIG. 1, an embodiment of the present application provides a semiconductor device. The semiconductor device 1 includes a thin film transistor 10, and the thin film transistor 10 includes:

a substrate 11;
a buffer layer 13 disposed on a side of the substrate 11: and
an active layer 15 disposed on a side of the buffer layer 13 away from the substrate 11,
wherein the semiconductor device 1 further includes a metal layer 14, the metal layer 14 is disposed on a side of the active layer 15 facing the buffer layer 13, the metal layer 14 includes at least one metal block, and the metal block is in direct contact with at least part of the active layer 15.

An embodiment of the present application provides a semiconductor device. In the semiconductor device, a metal layer is provided on the side of the active layer facing the buffer layer, and the metal layer includes at least one metal block, so that the metal block is in direct contact with at least part of the active layer, then when the active layer is converted from amorphous silicon to polycrystalline silicon, due to the catalytic effect of the metal block, the size of the crystal grains in the polycrystalline silicon becomes larger, which reduces the crystal grain boundaries in the polycrystalline silicon and improves the mobility of the semiconductor device.

It should be noted that, in the drawings of the present application, since the crystal grain boundaries can be seen microscopically, the drawings of the present application show positions and schematic shapes of the crystal grain boundaries with solid lines.

In one embodiment, the metal block is disposed between the buffer layer and the active layer. By arranging the metal block between the buffer layer and the active layer, when forming polysilicon, the metal block can catalyze a reaction process of amorphous silicon, and the metal block acts as a crystal nucleus, so that a width of the formed crystal grain becomes larger, and thereby a number of grain boundaries is reduced and a mobility of the semiconductor device is improved.

To address the problem of impacting electrical properties of the active layer due to a reduced thickness of the active layer when the metal block is disposed between the buffer layer and the active layer, in one embodiment, the buffer layer is provided with a groove in a region in contact with the active layer, and the metal block is provided in the groove. By providing groove in the buffer layer, the metal block is arranged in the groove, a surface of the active layer in contact with the buffer layer and the metal block is kept flat, so that the electrical properties of the active layer are better, and meanwhile the metal block acts as a catalyst to increase a width of the crystal grains of the active layer, reduce a number of grain boundaries, and improve the mobility of the semiconductor device.

Specifically, a material of the buffer layer includes silicon nitride, silicon oxide, or a stack of silicon nitride and silicon oxide.

Specifically, the thickness of the buffer layer ranges from 0.3 μm to 1 μm.

Specifically, depths of the grooves range from 0.05 microns to 0.5 microns, widths of the grooves range from 0.5 microns to 2 microns, a spacing between adjacent edges of adjacent ones of the grooves ranges from 0.5 microns to 3 microns, and a spacing between center points of adjacent ones of the grooves ranges from 1 micron to 5 microns. By making the depth of the grooves in the range of 0.05 to 0.5 microns, it is avoided that the depth of the grooves is too large, which leads to a small thickness of the buffer layer formed with grooves, so that the buffer layer has a better ability to block water and oxygen. In addition, the width of the grooves ranges from 0.5 microns to 2 microns, so that the metal blocks can be arranged in the grooves to catalyze the active layer and reduce the crystal grain boundaries: the spacing between adjacent edges of adjacent ones of the grooves ranges from 0.5 microns to 3 microns, and the spacing between the center points of adjacent ones of the grooves ranges from 1 micron to 5 microns, so that the metal blocks can have a certain period, the crystal grains can be larger, and the crystal grain boundaries can be reduced.

In one embodiment, a melting point of a material of the metal layer is less than 1410 degrees Celsius. By using a material with a melting point of less than 1410 degrees Celsius as the material of the metal layer, the melting point of the metal layer is lower than that of silicon, and the metal layer can easily form a solid solution with silicon, so that in the process of converting amorphous silicon to polysilicon, the metal layer is adopted to catalyzes the reaction process, thereby increasing sizes of the crystal grains of polysilicon and reducing grain boundaries.

In one embodiment, the material of the metal layer includes one of aluminum, nickel, gallium, or indium. By using aluminum, nickel, gallium, or indium as the material of the metal layer, the metal layer can easily form a solid solution with silicon, so that in the process of converting amorphous silicon to polysilicon, the metal layer catalyzes the reaction process and improves sizes of the crystal grains of polysilicon, thus reducing grain boundaries.

To address the problem of low mobility of the semiconductor device caused by more grain boundaries, in one embodiment, the semiconductor device includes a plurality of thin film transistors, and the active layer of at least one of the thin film transistors has no grain boundaries. By making the active layer of the thin film transistor free of grain boundaries, the particles will not be blocked by the crystal grain boundaries during the migration process, thereby improving the mobility of the semiconductor device.

Figure 2:
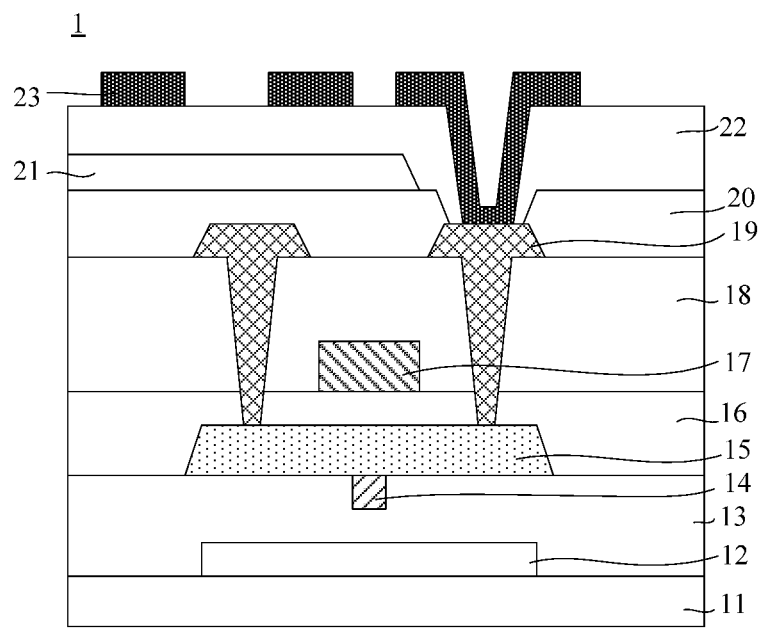
FIG. 2 is a second schematic diagram of the semiconductor device provided by an embodiment of the present application.

Specifically, as shown in FIG. 2, the metal layer 14 includes a metal block, and the active layer 15 includes single crystal silicon, and the diameter of a single crystal silicon is less than 5 μm. When the width of the active layer is less than 5 microns, a metal block can be arranged under the active layer, so that under the catalysis of the metal block, amorphous silicon is converted into single crystal silicon, and there is only one crystal grain, so that there is There is no grain boundary in the source layer, which improves the mobility of the semiconductor device.

Figure 3:
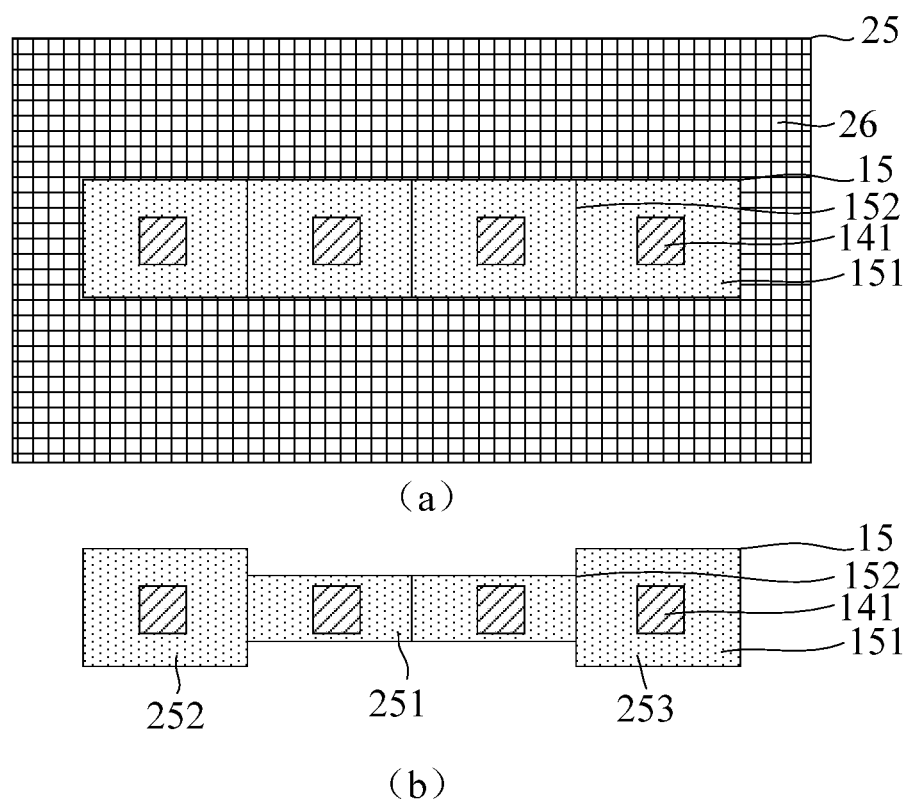
FIG. 3 is a first schematic diagram of an active layer provided by an embodiment of the present application.

In an embodiment, as shown in FIG. 1 and FIG. 3, the active layer 15 of the thin film transistor 10 includes a first crystal grain 151, and the first crystal grain 151 is arranged corresponding to the metal block 141, so a number of the first crystal grain 151 is equal to a number of the metal block 141. By arranging the first crystal grains and the metal blocks correspondingly, and the number of the first crystal grain is equal to the number of the metal block, the first crystal grains are formed under the catalysis of the metal blocks, and the diameter of the first crystal grains is larger, thereby reducing the number of grain boundaries, thus increasing the mobility of semiconductor devices.

Specifically, when the amorphous silicon is converted into polysilicon through a laser annealing process, the first crystal grains are formed through the catalysis of the metal block, even if there is still a crystal grain having a diameter smaller than the first crystal grains between the first crystal grains due to process limitations, the number of grain boundaries of the active layer can still be reduced due to the larger diameter of the first crystal grain, and the mobility of the semiconductor device can be improved.

In one embodiment, the first crystal grains are circular or quasi-circular, and diameters of the first crystal grains range from 1 to 5 microns. By setting the diameter of the first crystal grains to range from 1 micrometer to 5 micrometers, the first crystal grains are larger and the number of grain boundaries is less, thereby improving the mobility of the semiconductor device.

Specifically, as shown in FIGS. 1 and 3, the metal layer 14 includes metal blocks 141 arranged in an array, the active layer 15 includes a plurality of first crystal grains 151, and the number of the metal blocks 141 is equal to the number of the first crystal grains 151, and the crystal grain boundaries 152 of the first crystal grains are located between adjacent ones of the metal blocks 141. By making the number of metal blocks equal to the number of first crystal grains, each of the first crystal grains is formed through the catalysis of the metal blocks, and the width of each first crystal grain is larger, thereby reducing the number of grain boundaries and improving the mobility of the semiconductor device, and the first crystal grains will grow around the position of the metal blocks, so that the crystal grain boundaries of the first crystal grains is located between adjacent ones of the metal blocks. The width of the first crystal grains is adjusted to reduce the number of grain boundaries and improve the mobility of the semiconductor device.

Specifically, the thickness of the metal layer ranges from 0.05 microns to 0.5 microns. By setting the thickness of the metal layer to range from 0.05 microns to 0.5 microns, it is avoided that the thickness of the metal layer is too large to cause the thickness of the buffer layer to be small, and the intrusion of water and oxygen from a location where the thickness of the buffer layer is smaller is thus avoided.

Specifically, a spacing between the metal blocks is 1 μm to 5 μm. By setting the array period of the metal blocks to be 1 μm to 5 μm, the width of the crystal grains is 1 μm to 5 μm, thereby reducing the number of grain boundaries and improving the mobility of the semiconductor device.

Specifically, the width of the metal block is in the range of 0.5 μm to 2 μm. When setting the metal blocks, if the width of a metal block is too small, the width of the grain will be small, resulting in a large number of grain boundaries and a low mobility of the semiconductor device. If the width of the metal block is too large, the aperture ratio of the display panel will be low, which will impact the transmittance of the display panel. Also, when the width of the metal block is too large, there may be multiple nucleation sites on the metal block, resulting in the formation of multiple crystal grains in one metal block, so that the width of the crystal grains is small and the crystal grain boundaries are more. The width of the block is set to be 0.5 micrometers to 2 micrometers, and the period of adjacent metal arrays is controlled to be 1 micrometer to 5 micrometers to prepare the crystal grains with widths of the crystal grains of 1 micrometer to 5 micrometers, so that the width of the formed crystal grains is larger, the number of boundaries is less, and the mobility of semiconductor devices is improved.

In an embodiment, as shown in FIG. 3, the active layer 15 includes a channel portion 251 and a first doping portion 252 and a second doping portion 253 located on opposite sides of the channel portion 251, a shape of a hypothetical connection line between the first doping portion 252 and the second doping portion 253 along the channel portion 251 between the first doping portion 252 and the second doping portion 253 is same as a hypothetical connection line between the metal blocks 141 corresponding to the first doping portion 252 and the second doping portion 253 of the thin film transistor along the channel portion. By making the shape of the hypothetical connection line between the first doping portion and the second doping portion along the channel portion between the first doping portion and the second doping portion the same as a hypothetical connection line between the metal blocks corresponding to the first doping portion and the second doping portion of the thin film transistor along the channel portion, so that, in the active layers with different arrangements, since the arrangement of the metal array can be changed, widths of the crystal grains of the active layers located in the channel portion, the first doping portion, and the second doping portion can be made larger, and thereby the number of grain boundaries can be reduced and the mobility of the semiconductor device can be improved.

Specifically, compared to using amorphous silicon as a catalyst to increase sizes of the crystal grains, since the metal blocks can be arranged in an array in the present application, the spacing and width of the metal blocks can be set according to the shape of the active layer required, so that the width of the crystal grains of the active layer is larger, and the number of grain boundaries is less. When the width of the active layer is small, single crystal silicon can also be formed to improve the mobility of the semiconductor device.

In an embodiment, as shown in FIG. 3, a shape of the hypothetical connection line between the first doping portion 252 and the second doping portion 253 along the channel portion 251 between the first doping portion 252 and the second doping portion 253 is a straight line, and the metal blocks 141 are arranged along the straight line in an array. By arranging the metal blocks along a linear array, the crystal grains in a region where the metal blocks are located can grow along directions of the metal blocks, so that a width of the crystal grains is larger, the number of grain boundaries is less, and the mobility of the semiconductor device is improved.

Specifically, as shown in (a) of FIG. 3, when the active layer is formed, the amorphous silicon layer is processed to obtain the polysilicon layer 25. Specifically, the amorphous silicon layer can be processed by laser annealing. A region of the source layer 15 is provided with metal blocks 141, so that the crystal grains of the active layer 15 grow faster under the catalysis of the metal blocks 141, and the width of the crystal grains is larger: and the area outside the active layer 15 has no metal blocks, so that the width of the crystal grains of an inactive portion 26 is smaller, and the number of grain boundaries is larger. Then, the polysilicon layer is etched, as shown in (b) of FIG. 3, the inactive portion 26 is removed and a pattern of the active layer is formed to obtain the active layer 15. At this time, a shape of a hypothetical connection line between the first doping portion and the second doping portion along the channel portion between the first doping portion and the second doping portion is same as a hypothetical connection line between the metal blocks corresponding to the first doping portion and the second doping portion of the thin film transistor along the channel portion: and the channel portion, the first doping portion, and the second doping portion are arranged along a setting direction of the metal blocks to obtain an active layer having an "I-shaped channel", and the width of the crystal grains of the active layer is large, the number of grain boundaries is less, and the semiconductor device higher mobility.

Figure 4:
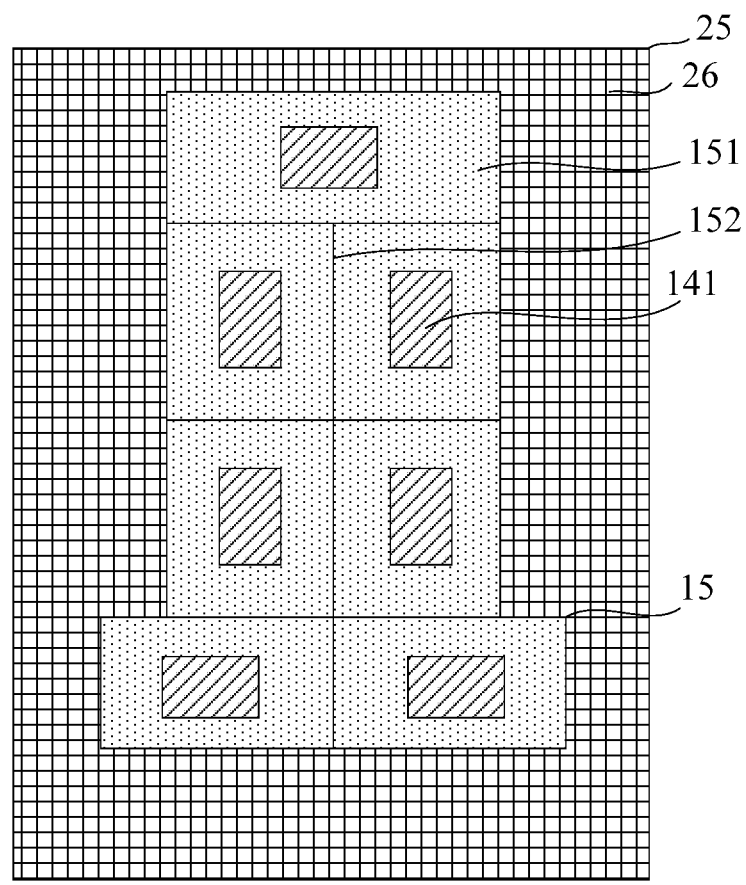
FIG. 4 is a second schematic diagram of an active layer provided by an embodiment of the present application.
Figure 4:
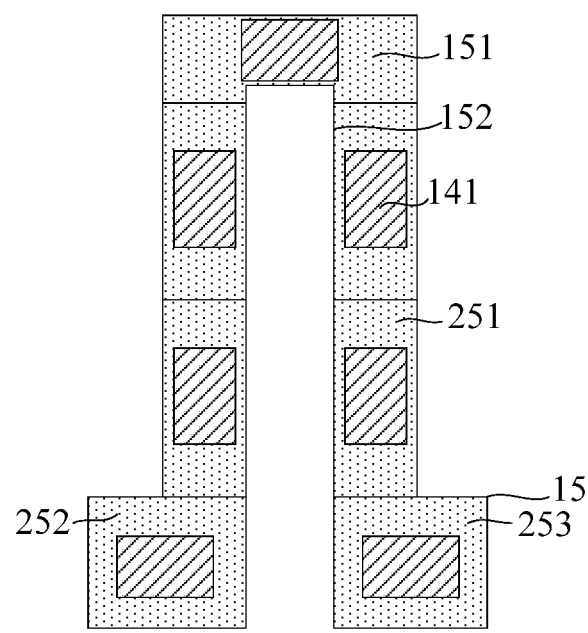

In an embodiment, as shown in FIG. 4, the first doping portion 252 and the second doping portion 253 are located on a same horizontal line, and the shape of the hypothetical connection line between the first doping portion 252 and the second doping portion 253 along the channel portion 251 between the first doping portion 252 and the second doping portion 253 is a polyline, and the metal blocks 141 are arranged along the polyline in an array. The formed channel portion, the first doping portion, and the second doping portion can be formed in a shape same as the shape formed by the metal blocks by making the metal blocks arranged along the polyline array, and due to the catalytic effect of the metal blocks, the crystal grains of the channel portion, the first doping portion, and the second doping portion have larger widths and fewer grain boundaries, thereby improving the mobility of the semiconductor device.

In an embodiment, as shown in FIG. 4, the channel portion 251 includes a first portion disposed in the vertical direction of the first doping portion 252, a second portion disposed in the vertical direction of a second doping portion 253, and a third portion vertically connected to the first portion and the second portion. The hypothetical connection line between the first doping portion 252 and the second doping portion 253 along the channel portion between the first doping portion 252 and the second doping portion 253 is arranged along the first portion, the third portion, and the second portion; and the metal blocks 141 are arranged in an array along the first portion, the third portion, and the second portion. By causing the metal block to include a portion disposed along the direction of the horizontal line, a portion perpendicular to the horizontally disposed portion, and a connected portion, and a connecting portion, the formed channel portion, the first doping portion, and the second doping portion can be formed in a shape same as the shape formed by the metal blocks. In addition, due to the catalytic effect of the metal blocks, the crystal grains of the channel portion, the first doping portion, and the second doping portion have larger widths and fewer grain boundaries, thereby improving the mobility of the semiconductor device.

Specifically, as shown in (a) of FIG. 4, when the active layer is formed, the amorphous silicon layer is processed to obtain the polysilicon layer 25. Specifically, the amorphous silicon layer can be processed by laser annealing. A region of the source layer 15 is provided with metal blocks 141, so that the crystal grains of the active layer 15 grow faster under the catalysis of the metal blocks 141, and the width of the crystal grains is larger: and the area outside the active layer 15 has no metal blocks, so that the width of the crystal grains of a inactive portion 26 is smaller, and the number of grain boundaries is larger. Then, the polysilicon layer is etched, as shown in (b) of FIG. 4, the inactive portion 26 is removed and a pattern of the active layer is formed to obtain the active layer 15. At this time, the channel portion of the active layer, the first doping portion, and the second doping portion are arranged along a setting direction of the metal blocks to obtain an active layer with a "zigzag channel". In addition, the width of the crystal grains of the active layer is large, the number of grain boundaries is less, and the mobility of semiconductor devices is high.

Figure 5:
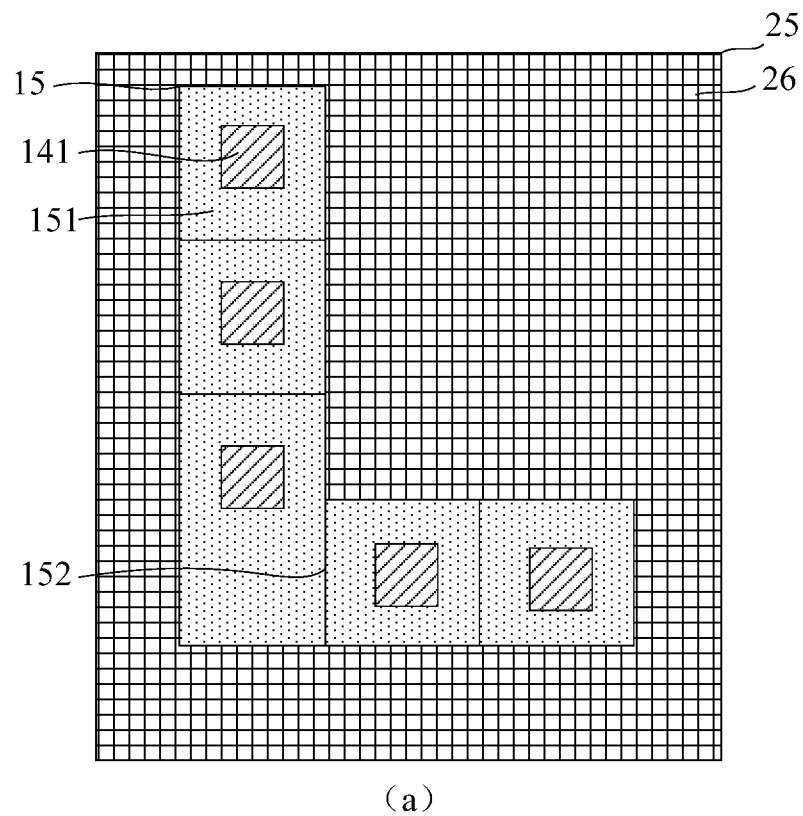
FIG. 5 is a third schematic diagram of an active layer provided by an embodiment of the present application.
Figure 5:
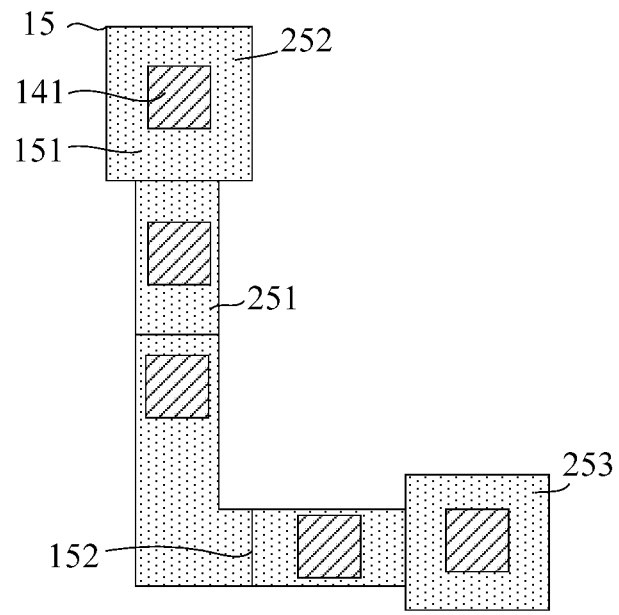

In an embodiment, as shown in FIG. 5, the channel portion 251 includes a fourth portion and a fifth portion connecting the first doping portion 252 and the second doping portion 253. The fourth portion and the fifth portion are arranged vertically, and the metal blocks 141 are arranged in an array along the direction of the fourth portion and the fifth portion. By making the metal block include mutually perpendicular portions, when the active layer is formed, the active layer can be formed along the metal block, and the channel portion, the first doping portion and the second doping portion can be formed due to the catalytic effect of the metal block. The width of the crystal grains in the portion is larger and the number of grain boundaries is less, thereby improving the mobility of the semiconductor device.

Specifically, as shown in (a) of FIG. 5, when the active layer is formed, the amorphous silicon layer is processed to obtain the polysilicon layer 25. Specifically, the amorphous silicon layer can be processed by laser annealing. A region of the source layer 15 is provided with metal blocks 141, so that the crystal grains of the active layer 15 grow faster under the catalysis by the metal blocks 141, and the width of the crystal grains is larger: and the area outside the active layer 15 has no metal blocks, so that the width of the crystal grains of a inactive portion 26 is smaller, and the number of grain boundaries is larger. Then, the polysilicon layer is etched, as shown in (b) of FIG. 5, the inactive portion 26 is removed and a pattern of the active layer is formed to obtain the active layer 15. At this time, the channel portion of the active layer, the first doping portion, and the second doping portion are arranged along a setting direction of the metal blocks to obtain an active layer with a "L-shaped channel". In addition, the width of the crystal grains of the active layer is large, the number of grain boundaries is less, and the mobility of semiconductor devices is high.

It should be noted that in FIG. 3, FIG. 4, and FIG. 5, no metal blocks are arranged under the polysilicon outside the active layer, the width of the crystal grains of the polysilicon outside the active layer is small and the number of grain boundaries is large, but embodiments of the present application are not particularly limited thereto, and for example, a metal block may also be provided under the polysilicon outside the active layer.

In an embodiment, as shown in FIG. 1, the diameter L1 of the first crystal grain is equal to the distance L2 between the center points of the adjacent ones of the metal blocks. By making the spacing between the center points of the metal blocks equal to the diameter of the first crystal grains, the width of the crystal grains in the active layer can be adjusted according to the spacing and width of the metal blocks, so that the crystal grain boundaries in the active layer is less, thereby improving the mobility of semiconductor devices.

Specifically, the metal blocks are arranged at equal intervals, and when a cross section of the first crystal grain is a trapezoid, the diameter of the first crystal grain refers to a width at a center line of the trapezoid.

Specifically, the above embodiments are described in detail by taking the metal blocks arranged at equal intervals as an example, but the embodiments of the present application are not particularly limited thereto. For example, when the required grain widths of the channel portion and the doping portion are different, the spacings of the metal blocks can be made different, and the sizes of the metal blocks can be made different, so that widths of the crystal grains of the channel portion and the doping portion can be different.

Specifically, compared with the current semiconductor device in which amorphous silicon is disposed in the buffer layer and then depositing amorphous silicon to increase widths of the crystal grains, disposing amorphous silicon in the buffer layer in the current semiconductor device will result in an increased thickness of amorphous silicon, and the amorphous silicon located in the buffer layer will increase nucleation sites during laser annealing, which will easily lead to an increase in the number of crystal grains, and the effect of increasing sizes of the crystal grains is not obvious. In comparison, in the embodiment of the present application, the metal block is used as the catalyst. Since the material of the metal block is different from that of amorphous silicon, the metal block will not combine with the amorphous silicon to increase the thickness of the amorphous silicon and change the performance, and the material of the metal block is different from the amorphous silicon, so that nucleation sites are not increased, which can increase the width of crystal grains, reduce the number of grain boundaries, and improve the mobility of semiconductor devices. In addition, compared with using amorphous silicon to increase widths of the crystal grains, the metal blocks can be arranged in an array in the present application, and the spacing and width of the metal blocks are set according to the shape of the active layer, so as to reduce the number of grain boundaries in the active layer. When the width of the source layer is small, single crystal silicon can also be obtained, and the mobility of the semiconductor device can be improved.

In an embodiment, as shown in FIG. 1, the semiconductor device 1 further includes a light-shielding layer 12, and the light-shielding layer 12 is disposed corresponding to the active layer 15.

In an embodiment, as shown in FIG. 1, the semiconductor device 1 further includes a gate insulating layer 16, a gate layer 17, an interlayer insulating layer 18, a source and drain layer 19, a planarization layer 20, a first electrode layer 21, a passivation layer 22, and a second electrode layer 23. The gate insulating layer 16 is arranged on a side of the active layer 15 away from the buffer layer 13, the gate layer 17 is arranged on a side of the gate insulating layer 16 away from the active layer 15, the interlayer insulating layer 18 is arranged on a side of the gate layer 17 away from the gate insulating layer 16, the source and drain layers 19 are arranged on a side of the interlayer insulating layer 18 away from the gate layer 17, the planarization layer 20 is arranged on a side of the source and drain layers 19 away from the interlayer insulating layer 18, the first electrode layer 21 is disposed on a side of the planarization layer 20 away from the source and drain layers 19, and the passivation layer 22 is disposed on a side of the first electrode layer 21 away from the planarization layer 20, the second electrode layer 23 is disposed on a side of the passivation layer 22 away from the first electrode layer 21.

Meanwhile, an embodiment of the present application provides a method of preparing a semiconductor device, and the method of fabricating a semiconductor device includes:

A substrate is provided, a light-shielding layer is formed on the substrate, a buffer layer is deposited on the light-shielding layer, and a groove is formed by exposure, development, and etching processes. The structure of the semiconductor device corresponding to this step is shown in (a) in FIG. 6.

Figure 6:
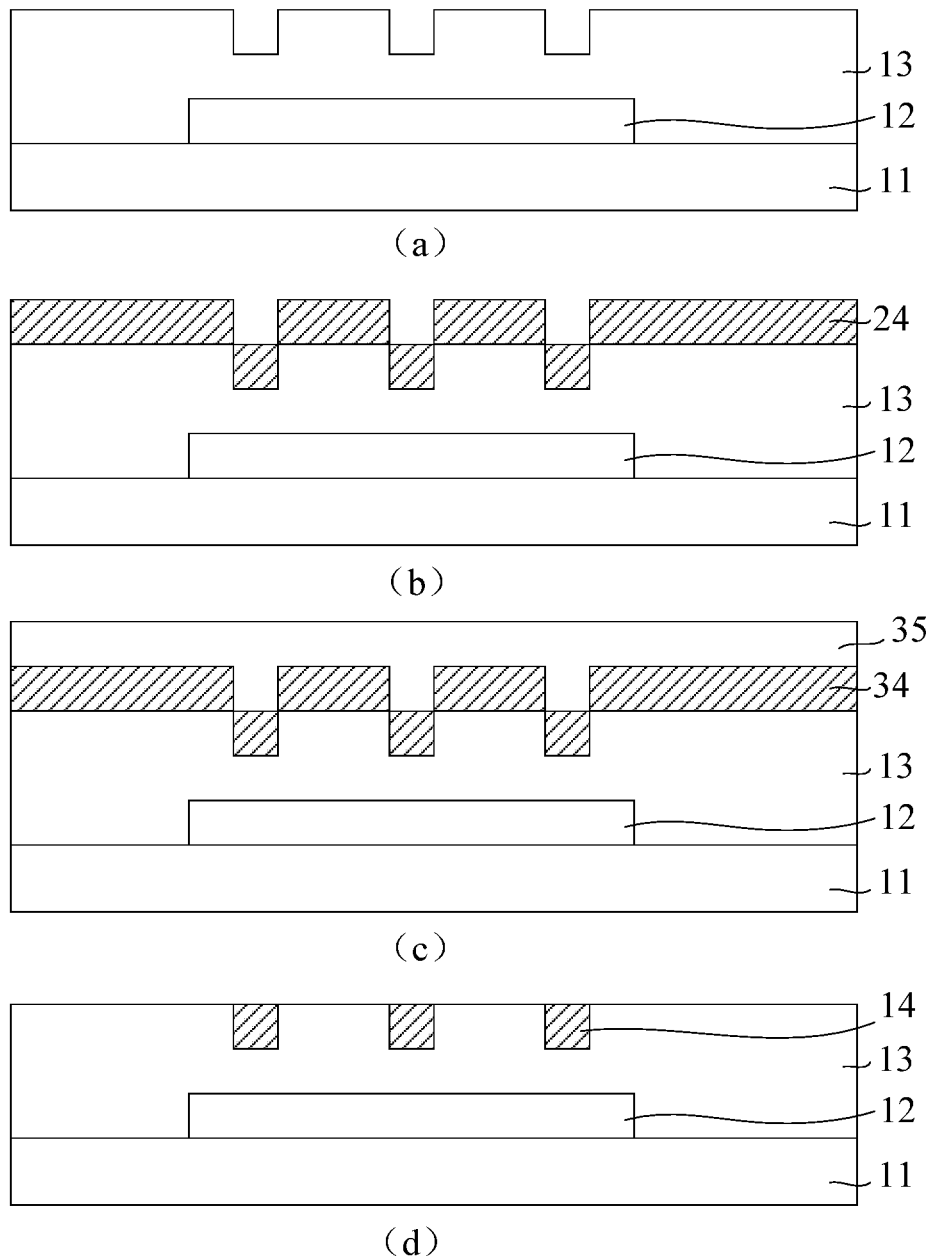
FIG. 6 is a first structural diagram of a semiconductor device corresponding to each step of a method of fabricating a semiconductor device provided in an embodiment of the present application.

Then, a metal layer is deposited on the buffer layer; the structure of the semiconductor device corresponding to this step is shown in (b) in FIG. 6.

Specifically, as shown in (b) of FIG. 6, when the metal thin film 24 is deposited on the buffer layer, since the buffer layer is provided with grooves, the metal 24 will be formed into the metal block at a position where the grooves are formed.

Then a photoresist is formed on the metal layer; the structure of the semiconductor device corresponding to this step is shown in (c) in FIG. 6;

Specifically, as shown in (c) of FIG. 6, by disposing the photoresist 35, the semiconductor device can be leveled to facilitate subsequent processes.

Then, the photoresist and the metal film on the buffer layer are blanketly etched by dry etching, and the etching process is controlled so that the etching is continued until the metal outside the groove is etched away, while the metal in the groove is remained. The structure of the semiconductor device corresponding to this step is shown in (d) in FIG. 6.

Figure 7:
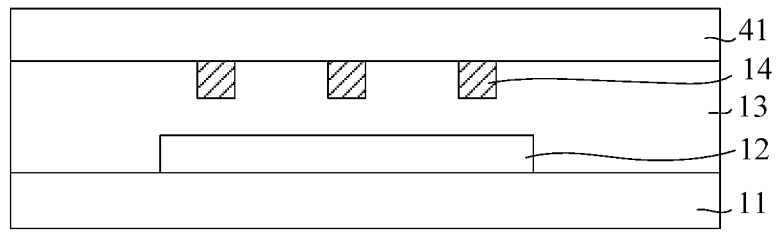
FIG. 7 is a second structural diagram of a semiconductor device corresponding to each step of the method of fabricating a semiconductor device provided in an embodiment of the present application.
Figure 7:
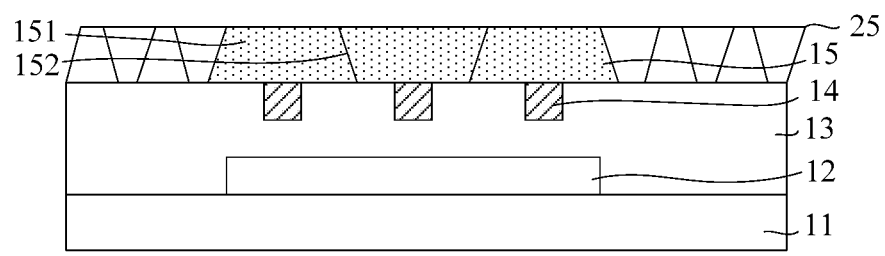
Figure 7:
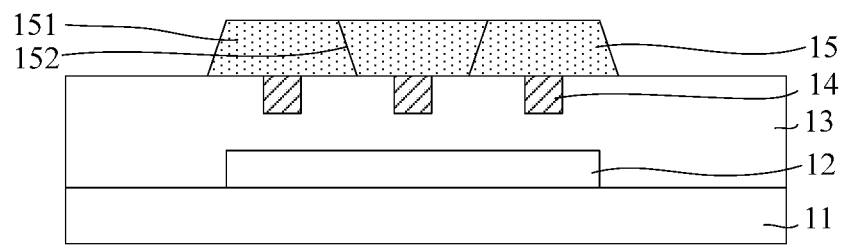

Then, an amorphous silicon layer is deposited on the buffer layer; and the structure of the semiconductor device corresponding to this step is shown in (a) in FIG. 7.

Specifically, as shown in (a) of FIG. 7, by forming the amorphous silicon layer 41 on the buffer layer, it is possible to form polycrystalline silicon from the amorphous silicon layer.

Then, laser annealing is performed on the amorphous silicon layer, so that the amorphous silicon layer is converted into a polysilicon layer; and the structure of the semiconductor device corresponding to this step is shown in (b) in FIG. 7.

Specifically, as shown in (b) of FIG. 7, when the amorphous silicon layer is converted into the polysilicon layer 25, the width of the crystal grains of polysilicon is different between the region where the metal block is present and the region where the metal block is not present. The number of grain boundaries is different, and the width of the polysilicon grains in the region where the metal block is present is larger, and the number of grain boundaries is less, so that when the active layer is formed, the width of the crystal grains of the active layer is larger, and the number of grain boundaries less, thereby improving the mobility of semiconductor devices.

Specifically, this step is described by taking the conversion of the amorphous silicon layer into the polycrystalline silicon layer as an example, but embodiments of the present application are not particularly limited thereto, and for example, the amorphous silicon layer can be converted into single crystal silicon.

Then, the polysilicon layer is exposed, developed, and etched to form an active layer; and the structure of the semiconductor device corresponding to this step is shown in (c) in FIG. 7.

Then, a gate insulating layer, a gate electrode layer, an interlayer insulating layer, a source and drain layer, a planarization layer, a first electrode layer, a passivation layer, and a second electrode layer are formed on the active layer to obtain a semiconductor device.

Meanwhile, an embodiment of the present application provides an electronic device, wherein the electronic device includes the semiconductor device described in any of the foregoing embodiments.

Specifically, the electronic device may be a liquid crystal display panel or an organic light-emitting diode display panel.

In view of the above embodiments, it can be known that:

Embodiments of the present application provide a semiconductor device and an electronic device: the semiconductor device includes a thin film transistor, the thin film transistor includes a substrate, a buffer layer, and an active layer; the buffer layer is disposed on a side of the substrate; and the active layer is disposed on a side of the buffer layer away from the substrate. The semiconductor device further includes a metal layer, the metal layer is disposed on a side of the active layer facing the buffer layer, the metal layer includes at least one metal block, and the metal block is in direct contact with at least part of the active layer. In the present application, a metal layer is disposed on a side of the active layer facing the buffer layer, and the metal layer includes at least one metal block, so that the metal block is in direct contact with at least part of the active layer, and when the active layer is converted from amorphous silicon to polysilicon, due to a catalytic effect of the metal block, a size of the crystal grains in the polysilicon becomes larger, which reduces grain boundaries in the polysilicon and improves the mobility of the semiconductor device.

In the above embodiments, the descriptions of each embodiment have their own emphasis. The parts that are not described in detail in an embodiment can be referred to the detailed descriptions in other embodiments above, which will not be repeated herein for brevity.

The semiconductor device and the electronic device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A semiconductor device, comprising a thin film transistor, wherein the thin film transistor comprises:
    a substrate;
    a buffer layer disposed on a side of the substrate; and
    an active layer disposed on a side of the buffer layer away from the substrate,
    wherein the semiconductor device further comprises a metal layer, the metal layer is disposed on a side of the active layer facing the buffer layer, the metal layer comprises at least one metal block, and the metal block is in direct contact with at least part of the active layer;
    wherein the active layer of the thin film transistor comprises a first crystal grain, the first crystal grain is disposed corresponding to the metal block, and a number of the first crystal grain is equal to a number of the metal block;
    wherein the first crystal grain is circular or quasi-circular, and a diameter of the first crystal grain is 1 to 5 microns.

2. The semiconductor device according to claim 1, wherein a region of the buffer layer in contact with the active layer is provided with a groove, and the metal block is provided in the groove.

3. The semiconductor device according to claim 1, wherein a material of the metal layer has a melting point of less than 1410 degrees Celsius.

4. The semiconductor device according to claim 3, wherein the material of the metal layer comprises at least one of aluminum, nickel, gallium, or indium.

5. The semiconductor device according to claim 1, wherein the semiconductor device further comprises a plurality of thin film transistors, and an active layer of at least one of the thin film transistors has no grain boundaries.

6. The semiconductor device according to claim 1, wherein the thin film transistor comprises a plurality of first crystal grains, the metal layer comprises metal blocks arranged in an array, and a grain boundary of the first crystal grains are located between adjacent ones of the metal blocks.

7. The semiconductor device according to claim 6, wherein the active layer comprises a channel portion and a first doping portion and a second doping portion located on opposite sides of the channel portion, a shape of a hypothetical connection line between the first doping portion and the second doping portion along the channel portion between the first doping portion and the second doping portion is same as a hypothetical connection line between the metal blocks corresponding to the first doping portion and the second doping portion of the thin film transistor along the channel portion.

8. The semiconductor device according to claim 7, wherein a shape of the hypothetical connection line between the first doping portion and the second doping portion along the channel portion between the first doping portion and the second doping portion is a straight line, and the metal blocks are arranged along the straight line in an array.

9. The semiconductor device according to claim 8, wherein the first doping portion and the second doping portion are located on a same horizontal line, and the shape of the hypothetical connection line between the first doping portion and the second doping portion along the channel portion between the first doping portion and the second doping portion is a polyline, and the metal blocks are arranged along the polyline in an array.

10. The semiconductor device according to claim 9, wherein the channel portion comprises a first portion disposed in a vertical direction of the first doping portion, a second portion disposed in a vertical direction of the second doping portion, and a third portion vertically connected to the first portion and the second portion; the hypothetical connection line between the first doping portion and the second doping portion along the channel portion between the first doping portion and the second doping portion is arranged along the first portion, the third portion, and the second portion; and the metal blocks are arranged in an array along the first portion, the third portion, and the second portion.

11. The semiconductor device according to claim 9, wherein the channel portion comprises a fourth portion and a fifth portion connecting the first doping portion and the second doping portion, the fourth portion is arranged perpendicular to the fifth portion, and the metal blocks are arranged in an array along a direction of the fourth portion and the fifth portion.

12. The semiconductor device according to claim 6, wherein a diameter of the first crystal grains is equal to a distance between center points of adjacent ones of the metal blocks.

13. The semiconductor device according to claim 6, wherein a thickness of each of the metal blocks ranges from 0.05 microns to 0.5 microns.

14. The semiconductor device according to claim 6, wherein a spacing between the metal blocks is 1 to 5 microns.

15. The semiconductor device according to claim 6, wherein a width of each of the metal blocks ranges from 0.5 microns to 2 microns.

16. An electronic device, comprising the semiconductor device according to claim 1.

17. The electronic device according to claim 16, wherein the electronic device further comprises a liquid crystal display panel.

18. The electronic device according to claim 16, wherein the electronic device further comprises an organic light-emitting diode display panel.

* * * * *